United States Patent
Kuroda

(10) Patent No.: US 11,212,473 B2
(45) Date of Patent: Dec. 28, 2021

(54) PHOTOELECTRIC CONVERSION DEVICE HAVING PIXELS COMPRISING DIFFERENT SIZE COUNTERS

(71) Applicant: CANON KABUSHIKI KAISHA, Tokyo (JP)

(72) Inventor: Yukihiro Kuroda, Inagi (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/979,623

(22) PCT Filed: Mar. 15, 2019

(86) PCT No.: PCT/JP2019/010975
§ 371 (c)(1),
(2) Date: Sep. 10, 2020

(87) PCT Pub. No.: WO2019/181809
PCT Pub. Date: Sep. 26, 2019

(65) Prior Publication Data
US 2021/0044768 A1 Feb. 11, 2021

(30) Foreign Application Priority Data
Mar. 19, 2018 (JP) .............................. JP2018-050662

(51) Int. Cl.
*H04N 5/369* (2011.01)
*H04N 5/355* (2011.01)
(Continued)

(52) U.S. Cl.
CPC ... *H04N 5/36963* (2018.08); *H01L 27/14634* (2013.01); *H04N 5/35563* (2013.01); *H04N 5/379* (2018.08); *H04N 5/37455* (2013.01)

(58) Field of Classification Search
CPC .............................................. H04N 5/335–379
See application file for complete search history.

(56) References Cited

U.S. PATENT DOCUMENTS

| | | |
|---|---|---|
| 4,710,817 A | 12/1987 | Ando |
| 7,709,869 B2 | 5/2010 | Kuroda .......................... 257/291 |

(Continued)

FOREIGN PATENT DOCUMENTS

| | | |
|---|---|---|
| JP | 2001-8104 | 1/2001 |
| JP | 2018-50234 | 3/2018 |
| WO | 2012/021450 | 2/2012 |

OTHER PUBLICATIONS

International Search Report of the International Search Authority (JPO) issued in International Application No. PCT/JP2019/010975 dated Jul. 9, 2019.

(Continued)

*Primary Examiner* — Paul M Berardesca
(74) *Attorney, Agent, or Firm* — Venable LLP

(57) ABSTRACT

An embodiment includes a plurality of pixels each including a light receiving unit that outputs a pulse in response to incidence of a photon, and a signal generation unit that generates a signal in accordance with the number of pulses output from the light receiving unit, wherein the plurality of pixels includes a first pixel in which an upper limit value of a signal generated by the signal generation unit is a first value and a second pixel in which an upper limit value of a signal generated by the signal generation unit is a second value that is smaller than the first value.

20 Claims, 14 Drawing Sheets

(51) Int. Cl.
*H04N 5/3745* (2011.01)
*H01L 27/146* (2006.01)

(56) References Cited

U.S. PATENT DOCUMENTS

| | | | |
|---|---|---|---|
| 7,911,521 B2 | 3/2011 | Kuroda et al. | 348/301 |
| 7,935,995 B2 | 5/2011 | Watanabe et al. | 257/292 |
| 8,174,599 B2 | 5/2012 | Kuroda et al. | 348/301 |
| 8,222,682 B2 | 7/2012 | Watanabe et al. | 257/292 |
| 8,223,238 B2 | 7/2012 | Kuroda et al. | 348/308 |
| 8,345,137 B2 | 1/2013 | Shinohara et al. | 348/308 |
| 8,390,713 B2 | 3/2013 | Kuroda et al. | 348/301 |
| 8,670,058 B2 | 3/2014 | Hayashi et al. | 348/296 |
| 8,710,558 B2 | 4/2014 | Inoue et al. | 257/290 |
| 8,994,862 B2 | 3/2015 | Kuroda et al. | 348/301 |
| 9,118,854 B2 | 8/2015 | Ichikawa | |
| 9,236,406 B2 | 1/2016 | Kuroda | H01L 27/14641 |
| 9,305,954 B2 | 4/2016 | Kato et al. | H01L 27/14621 |
| 9,357,122 B2 | 5/2016 | Kususaki et al. | G03B 13/36 |
| 9,445,023 B2 | 9/2016 | Kuroda et al. | H04N 5/37455 |
| 9,721,609 B2 | 8/2017 | Kobuse | |
| 9,762,837 B2 | 9/2017 | Kuroda et al. | H04N 5/3575 |
| 10,021,316 B2 | 7/2018 | Kuroda | H04N 5/3559 |
| 10,404,932 B2 | 9/2019 | Kuroda et al. | H01L 27/14603 |
| 10,609,320 B2 | 3/2020 | Kuroda et al. | H04N 5/3745 |
| 10,652,496 B2 | 5/2020 | Goden et al. | H04N 5/37457 |
| 2007/0002134 A1 | 1/2007 | Ishihara | |
| 2009/0040328 A1 | 2/2009 | Suzuki | |
| 2009/0290680 A1 | 11/2009 | Tumer | |
| 2011/0134295 A1 | 6/2011 | Hashimoto | |
| 2012/0044392 A1 | 2/2012 | Endo | |
| 2012/0175503 A1 | 7/2012 | Kuroda et al. | 250/214 A |
| 2014/0016748 A1 | 1/2014 | Spahn | |
| 2014/0327802 A1 | 11/2014 | Mabuchi | |
| 2015/0162925 A1 | 6/2015 | Lee | |
| 2015/0185222 A1 | 7/2015 | Cho | |
| 2015/0185333 A1 | 7/2015 | Cho | 250/394 |
| 2015/0200222 A1 | 7/2015 | Webster | |
| 2017/0352697 A1 | 12/2017 | Onuki | |
| 2019/0305146 A1 | 10/2019 | Kuroda | H01L 31/107 |
| 2020/0084396 A1 | 3/2020 | Kuroda | G01J 2001/444 |
| 2020/0296307 A1* | 3/2020 | Ogawa | |
| 2020/0158566 A1 | 5/2020 | Ota et al. | H04N 5/37455 |
| 2020/0194216 A1 | 6/2020 | Ikeda et al. | H01J 37/244 |

OTHER PUBLICATIONS

PCT Collaborative Search & Examination Pilot Upload peer contribution by the United States Patent Office as the ISA, uploaded on May 28, 2019.
PCT Collaborative Search & Examination Pilot Upload peer contribution by the European Patent Office as the ISA, uploaded on Jun. 27, 2019.
PCT Collaborative Search & Examination Pilot Upload peer contribution by the Korean Intellectual Property Office as the ISA, uploaded on Jun. 13, 2019.
PCT Collaborative Search & Examination Pilot Upload peer contribution by the China National Intellectual Property Office as the ISA, uploaded on Jun. 3, 2019.

* cited by examiner

| A | B | Bi | D | Bo |
|---|---|----|---|----|
| 0 | 0 | 0  | 0 | 0  |
| 0 | 0 | 1  | 1 | 1  |
| 0 | 1 | 0  | 1 | 1  |
| 0 | 1 | 1  | 0 | 1  |
| 1 | 0 | 0  | 1 | 0  |
| 1 | 0 | 1  | 0 | 0  |
| 1 | 1 | 0  | 0 | 0  |
| 1 | 1 | 1  | 1 | 1  |

# PHOTOELECTRIC CONVERSION DEVICE HAVING PIXELS COMPRISING DIFFERENT SIZE COUNTERS

This application is a National Stage application under § 371 of International Application No. PCT/JP2019/010975, filed on Mar. 15, 2019.

TECHNICAL FIELD

The present invention relates to a photoelectric conversion device, an imaging system, and a movable object.

BACKGROUND ART

A photoelectric conversion device that digitally counts the number of photons arriving at a light receiving unit and outputs the count value as a digital signal from a pixel is known. Patent Literature 1 discloses a photoelectric conversion device in which a plurality of pixels each configured to output a count value of photons as a digital signal are arranged. Patent Literature 1 employs stacked structure of a substrate on which light receiving units are provided and a substrate on which a pixel circuit unit is provided, so that the size of the photoelectric conversion device is reduced or the definition of an acquired image is increased.

CITATION LIST

Patent Literature

PTL 1: U.S. Patent Application Publication No. 2015/0200222

SUMMARY OF INVENTION

Technical Problem

For further enhancement of the function of a photoelectric conversion device, there is a demand for performing various signal processing inside a pixel. However, it is necessary to increase the circuit size or the layout area of a pixel circuit in order to add a signal processing circuit inside a pixel, which has been an obstacle to reduction in the size of the photoelectric conversion device or increase in the definition of an acquired image.

The present invention intends to provide a photoelectric conversion device that can realize enhancement of the function thereof without increasing the size of a pixel circuit.

Solution to Problem

According to one aspect of the present invention, provided is a photoelectric conversion device including a plurality of pixels each including a light receiving unit that outputs a pulse in response to incidence of a photon, and a signal generation unit that generates a signal in accordance with the number of pulses output from the light receiving unit, wherein the plurality of pixels includes a first pixel in which an upper limit value of a signal generated by the signal generation unit is a first value and a second pixel in which an upper limit value of a signal generated by the signal generation unit is a second value that is smaller than the first value.

Advantageous Effects of Invention

According to the present invention, it is possible to enhance the function of a photoelectric conversion device without increasing the size of a pixel circuit.

Further features of the present invention will become apparent from the following description of exemplary embodiments with reference to the attached drawings.

DESCRIPTION OF EMBODIMENTS

Preferred embodiments of the present invention will now be described in detail in accordance with the accompanying drawings.

First Embodiment

A photoelectric conversion device according to a first embodiment of the present invention will be described with reference to FIG. 1 to FIG. 7.

Figure 1:
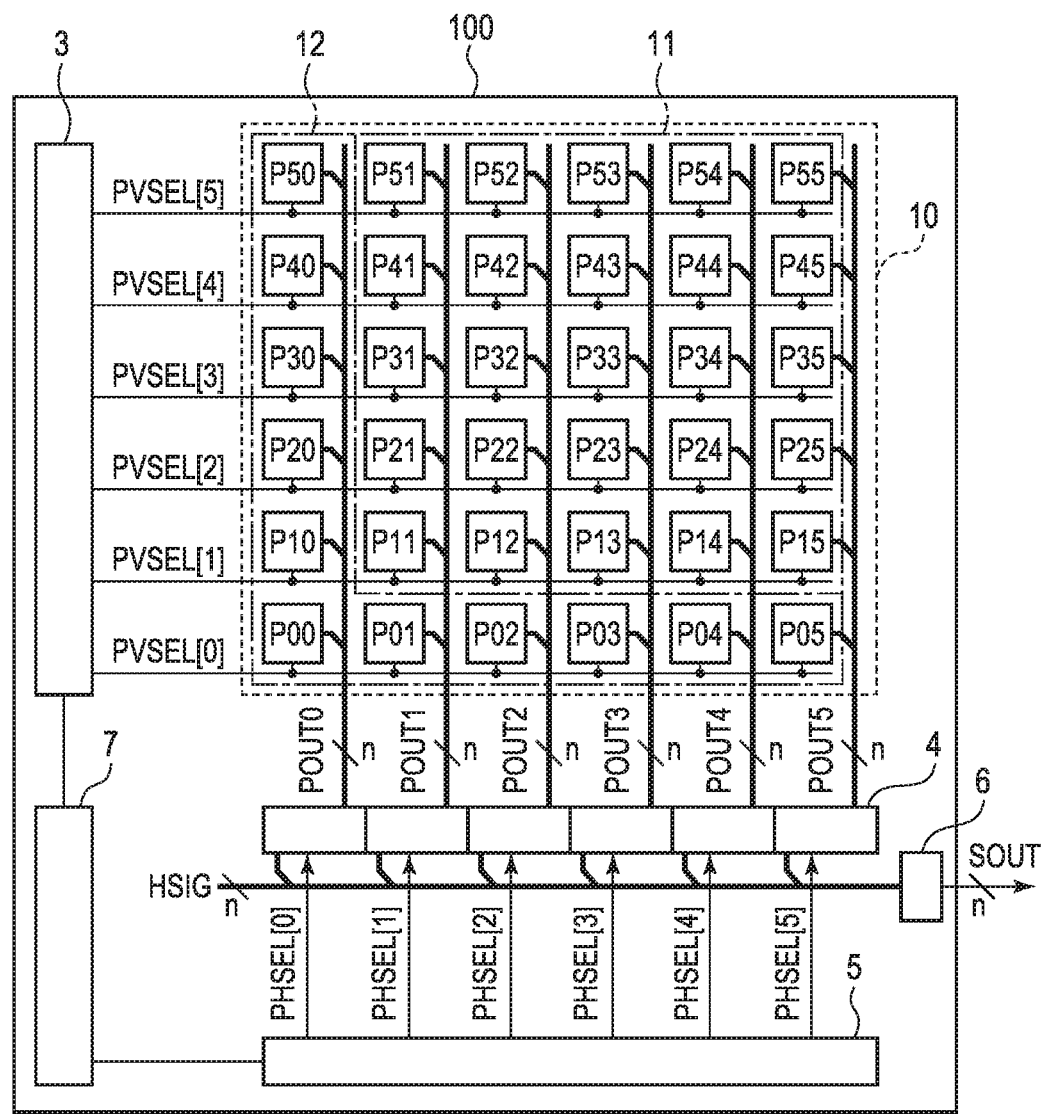
FIG. 1 is a block diagram illustrating a general configuration of a photoelectric conversion device according to a first embodiment of the present invention.

FIG. 1 is a block diagram illustrating a general configuration of the photoelectric conversion device according to the present embodiment. As illustrated in FIG. 1, a photoelectric conversion device 100 according to the present embodiment includes a pixel region 10, a vertical select circuit 3, signal processing circuits 4, a horizontal select circuit 5, an output circuit 6, and a control circuit 7.

In the pixel region 10, a plurality of unit pixels P arranged in a matrix over a plurality of rows and a plurality of columns are provided. FIG. 1 illustrates 36 unit pixels P arranged on six rows from the 0th row to the fifth row and six columns from the 0th column to the fifth column together with references denoting row numbers and column numbers. For example, the unit pixel P on the first row, the fourth column is labeled with the reference "P14". Note that the number of rows and the number of columns of a pixel array forming the pixel region 10 are not particularly limited.

The pixel region 10 includes a light receiving region 11 and an optical black region (hereafter, referred to as an "OB region") 12. In the example of FIG. 1, the light receiving region 11 is provided in a region where five rows by five columns of the unit pixels P from the unit pixel P11 to the unit pixel P55 are arranged. The OB region 12 is typically arranged along two sides of the periphery of the light receiving region 11. In the example of FIG. 1, the OB region 12 is arranged in an L-shape region including the unit pixels P on the 0th row and the unit pixels P on the 0th column. The OB region 12 has a light-shielding member that blocks an incident light, for example, a light-shielding layer. Note that the arrangement of the light receiving region 11 and the OB region 12 is not particularly limited.

On each row of the pixel array of the pixel region 10, a control line PVSEL is arranged extending in a first direction (the horizontal direction in FIG. 1). Each of the control lines PVSEL is connected to the unit pixels P aligned in the first direction to form a signal line common to these unit pixels P. The first direction in which the control line PVSEL extends may be referred to as a row direction or the horizontal direction. Note that FIG. 1 illustrates the control lines PVSEL together with the references denoting the row number. For example, the control line on the first row is labeled with the reference "PVSEL[1]".

The control line PVSEL on each row is connected to the vertical select circuit 3. The vertical select circuit 3 is a circuit unit that supplies, to the unit pixels P via the control lines PVSEL, control signals used for driving signal generation circuits (not illustrated) within the unit pixels P.

On each column of the pixel array of the pixel region 10, an output line POUT is arranged extending in a second direction (the vertical direction in FIG. 1) intersecting the first direction. Each of the output lines POUT is connected to the unit pixels P arranged in the second direction to form a signal line common to these unit pixels P. The second direction in which the output line POUT extends may be referred to as a column direction or the vertical direction. Note that FIG. 1 illustrates the output lines POUT together with the references denoting the column number. For example, the output line on the fourth column is labeled with the reference "POUT4". Each of the output lines POUT has n signal lines used for outputting an n-bit digital signal.

The output lines POUT are connected to the signal processing circuits 4. The signal processing circuits 4 are provided to respective columns of the pixel array of the pixel region 10 and connected to the output lines POUT on the corresponding columns. Each of the signal processing circuits 4 has a function of holding a signal read out from the unit pixels P via the output line POUT on the corresponding column. Since signals output from the unit pixels P correspond to an n-bit signal input via n signal lines of the output lines POUT, each of the signal processing circuits 4 includes at least n holding units used for holding signals of respective bits.

The horizontal select circuit 5 is a circuit unit that supplies, to the signal processing circuits 4, control signals used for reading out signals from the signal processing circuits 4. The horizontal select circuit 5 supplies control signals via control lines PHSEL to the signal processing circuits 4 on respective columns. The signal processing circuit 4 that has received a control signal from the horizontal select circuit 5 outputs a signal held in the holding unit to the output circuit 6 via a horizontal output line HSIG. Note that FIG. 1 illustrates the control lines PHSEL together with references denoting column numbers. For example, the control line on the fourth column is labeled with the reference "PHSEL[4]". Each of the horizontal output lines HSIG has n signal lines used for outputting an n-bit digital signal.

The output circuit 6 is a circuit unit that outputs a signal supplied via the horizontal output line HSIG to the outside of the photoelectric conversion device 100 as an output signal SOUT. The control circuit 7 is a circuit unit that supplies control signals used for controlling the operation or the timing thereof of the vertical select circuit 3, the signal processing circuits 4, the horizontal select circuit 5, and the output circuit 6. Note that at least some of the control signals that control the operation or the timing thereof of the vertical select circuit 3, the signal processing circuits 4, the horizontal select circuit 5, and the output circuit 6 may be supplied from the outside of the photoelectric conversion device 100.

Here, the photoelectric conversion device 100 according to the present embodiment includes first pixels P1 and second pixels P2 as the plurality of unit pixels P arranged in the pixel region 10. For example, the first pixels P1 are the unit pixels P arranged in the light receiving region 11, and the second pixels P2 are the unit pixels P arranged in the OB region 12.

Figure 2:
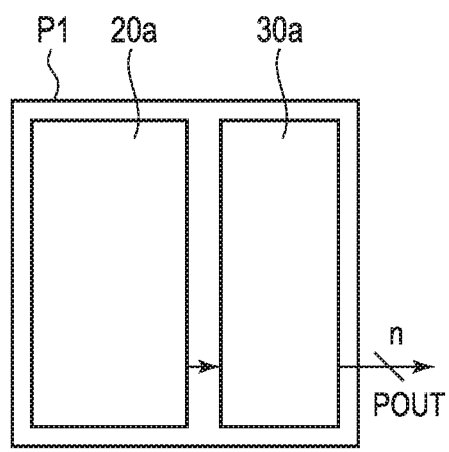
FIG. 2 is a conceptual diagram illustrating a configuration of a first pixel of the photoelectric conversion device according to the first embodiment of the present invention.
Figure 3:
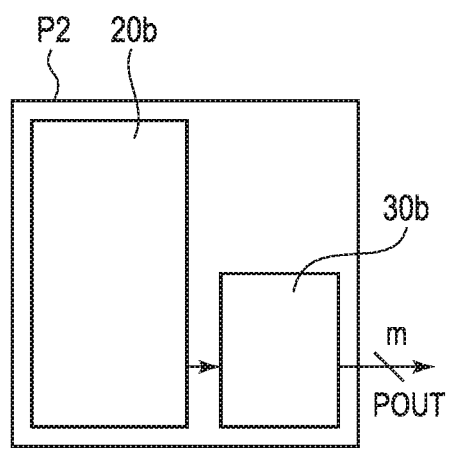
FIG. 3 is a conceptual diagram illustrating a configuration of a second pixel of the photoelectric conversion device according to the first embodiment of the present invention.

FIG. 2 and FIG. 3 are conceptual diagram illustrating the configuration of the first pixel P1 and the second pixel P2 in the photoelectric conversion device 100 according to the present embodiment. As illustrated in FIG. 2, the first pixel P1 includes a light receiving unit 20a and a signal generation unit 30a. The light receiving unit 20a outputs a pulse indicating the presence of photon incidence in response to light incidence. The signal generation unit 30a generates a cumulative signal obtained by integrating or cumulatively summing the number of pulses output from the light receiving unit 20a. Similarly, as illustrated in FIG. 3, the second pixel P2 includes a light receiving unit 20b and a signal generation unit 30b. The light receiving unit 20b outputs a pulse indicating the presence of photon incidence in response to light incidence. The signal generation unit 30b generates a cumulative signal obtained by integrating or cumulatively summing the number of pulses output from the light receiving unit 20b.

The signal generation unit 30b of the second pixel P2 is configured such that the circuit size or the layout area is smaller than that of the signal generation unit 30a of the first pixel P1. As one scheme of such a configuration, in the present embodiment, the signal generation units 30a and 30b are configured such that the upper limit value of a signal generated by the signal generation unit 30b of the second pixel P2 is smaller than the upper limit value of a signal generated by the signal generation unit 30a of the first pixel P1. For example, the signal generation unit 30a includes the n-bit counter circuit and is configured to output an n-bit signal. In contrast, the signal generation unit 30b includes a counter circuit of m bits smaller than n bits and is configured to output an m-bit signal.

Figure 4:
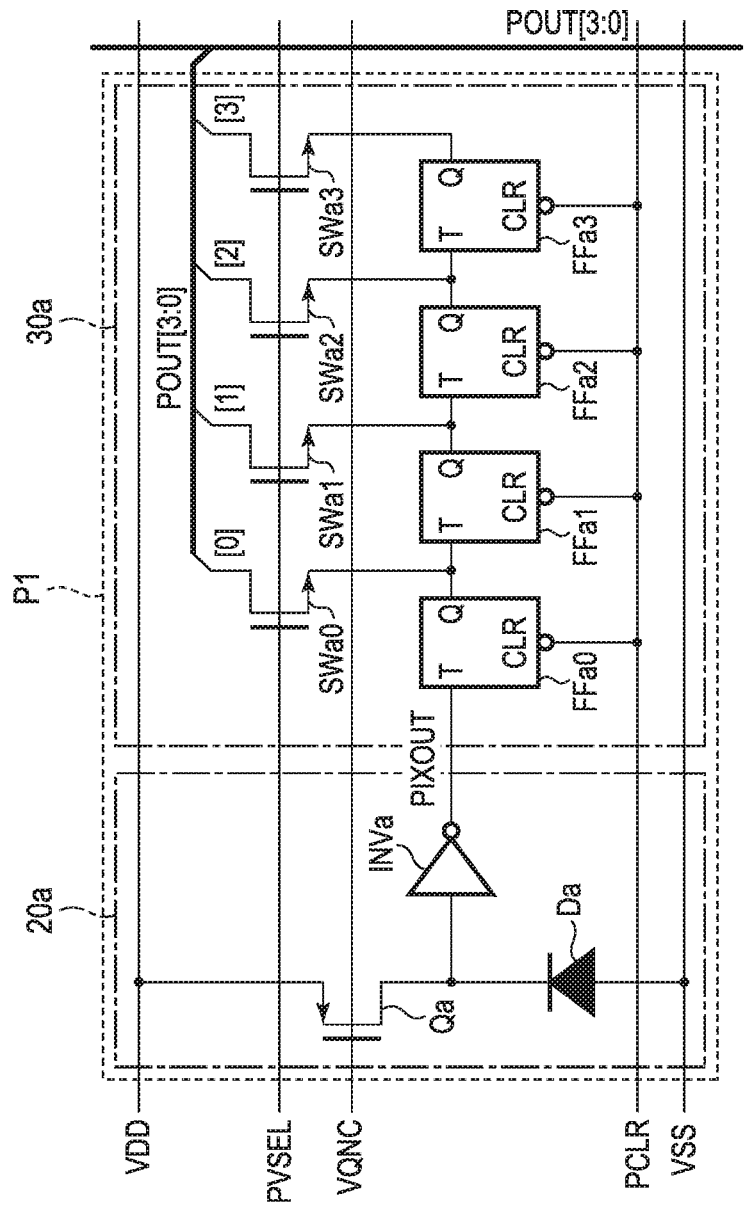
FIG. 4 is a circuit diagram illustrating a configuration example of the first pixel of the photoelectric conversion device according to the first embodiment of the present invention.
Figure 5:
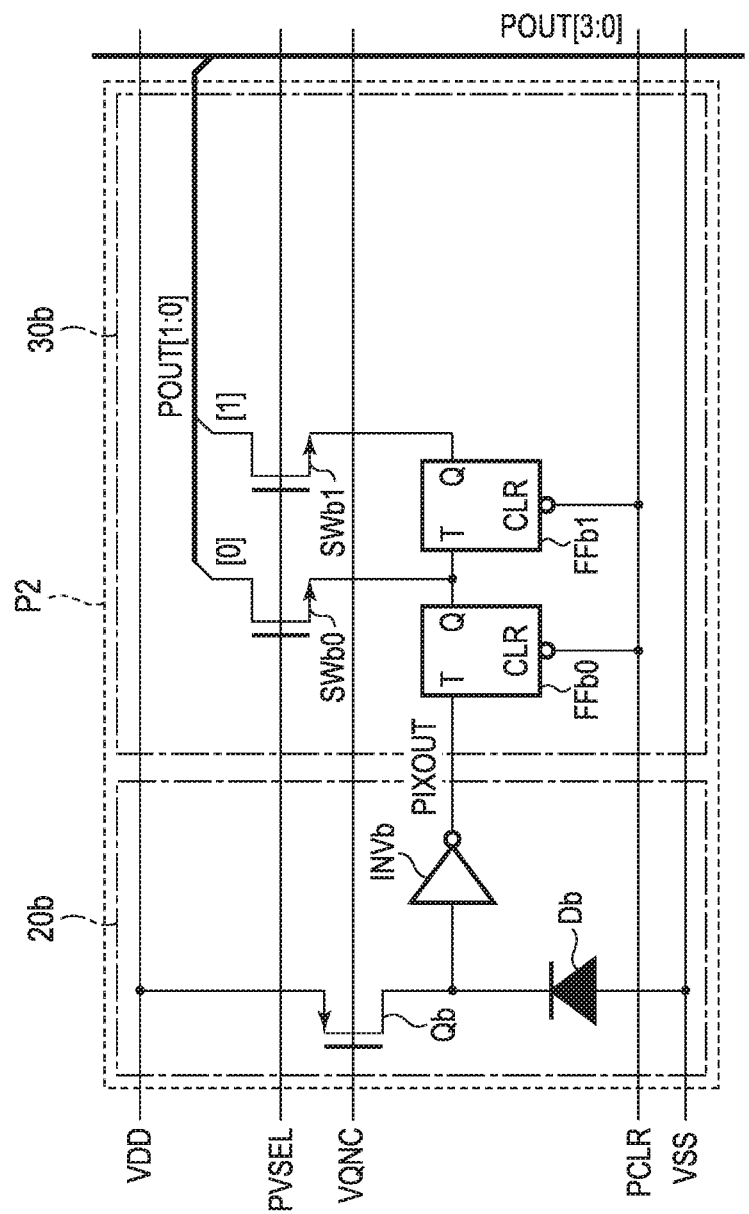
FIG. 5 is a circuit diagram illustrating a configuration example of the second pixel of the photoelectric conversion device according to the first embodiment of the present invention.

The specific configuration example of the first pixel P1 and the second pixel P2 will be described by using FIG. 4 and FIG. 5. FIG. 4 is a circuit diagram illustrating the configuration example of the first pixel P1. FIG. 5 is a circuit diagram illustrating the configuration example of the second pixel P2.

As illustrated in FIG. 4, the first pixel P1 includes the light receiving unit 20a and the signal generation unit 30a. The light receiving unit 20a includes an avalanche multiplying diode Da, a quenching element Qa formed of a p-channel MOS transistor, and an inverter circuit INVa. The signal generation unit 30a includes four T-flip-flop circuits FFa0, FFa1, FFa2, and FFa3 forming a four-bit counter circuit and switches SWa0, SWa1, SWa2, and SWa3 formed of n-channel MOS transistors.

The anode of the diode Da is connected to a reference voltage node (voltage VSS), and the cathode of the diode Da is connected to the drain of the p-channel MOS transistor forming the quenching element Qa. The source of the p-channel MOS transistor forming the quenching element Qa is connected to the power source voltage node (voltage VDD). The input terminal of the inverter circuit INVa is connected to the connection node between the diode Da and the quenching element Qa. The output terminal of the inverter circuit INVa, which is also the output terminal of the light receiving unit 20a, is connected to the input terminal T of the T-flip-flop circuit FFa0, which is the input terminal of the signal generation unit 30a.

The output terminal Q of the T-flip-flop circuit FFa0 is connected to the input terminal T of the T-flip-flop circuit FFa1. The connection node between the output terminal Q of the T-flip-flop circuit FFa0 and the input terminal T of the T-flip-flop circuit FFa1 is connected to the source of the n-channel MOS transistor forming the switch SWa0. The output terminal Q of the T-flip-flop circuit FFa1 is connected to the input terminal T of the T-flip-flop circuit FFa2. The connection node between the output terminal Q of the T-flip-flop circuit FFa1 and the input terminal T of the T-flip-flop circuit FFa2 is connected to the source of the n-channel MOS transistor forming the switch SWa1. The output terminal Q of the T-flip-flop circuit FFa2 is connected to the input terminal T of the T-flip-flop circuit FFa3. The connection node between the output terminal Q of the T-flip-flop circuit FFa2 and the input terminal T of the T-flip-flop circuit FFa3 is connected to the source of the n-channel MOS transistor forming the switch SWa2. The output terminal Q of the T-flip-flop circuit FFa3 is connected to the source of the n-channel MOS transistor forming the switch SWa3.

The gate of the p-channel MOS transistor forming the quenching element Qa is connected to the power source that supplies a voltage VQNC used for obtaining a predetermined quenching resistance. The gates of the n-channel MOS transistors forming the switches SWa0, SWa1, SWa2, and SWa3 are connected to the control line PVSEL. The drains of the n-channel MOS transistors forming the switches SWa0, SWa1, SWa2, and SWa3 are connected to the output line POUT. The clear terminals CLR of the T-flip-flop circuits FFa0, FFa1, FFa2, and FFa3 are connected to the vertical select circuit 3 and can be supplied with the control signal PCLR from the vertical select circuit 3.

A reverse bias voltage whose value is greater than or equal to a breakdown voltage is applied to the diode Da via the quenching element Qa. Thereby, the diode Da is set so as to operate in a Geiger mode. In response to photon incidence to the diode Da, a plurality of electrons (and holes) occur due to an avalanche phenomenon. A flow of a current generated due to the avalanche phenomenon through the quenching element Qa causes a voltage drop at the quenching element Qa, and the operation region of the diode Da is out of the Geiger mode. Once the avalanche phenomenon of the diode Da stops, the voltage drop at the quenching element Qa returns to the original state, and the operation region of the diode Da again enters a Geiger mode. The inverter circuit INVa inverts and amplifies a change in the potential at the cathode of the diode Da. With such a configuration, the light receiving unit 20a can output the presence of photon incidence as a voltage pulse signal (signal PIXOUT).

The four-bit counter circuit in which the T-flip-flop circuits FFa0 to FFa3 are sequentially connected counts pulses superimposed on the signal PIXOUT supplied from the light receiving unit 20a. When turned on in response to a control signal supplied from the control line PVSEL, the switches SWa0 to SWa3 output the output signal of the counter circuit formed by the T-flip-flop circuits FFa0 to FFa3 to the output line POUT. The counter circuit formed of the T-flip-flop circuits FFa0 to FFa3 is configured to reset the counter output signal by using the control signal PCLR supplied from the vertical select circuit 3.

As illustrated in FIG. 5, the second pixel P2 includes the light receiving unit 20b and the signal generation unit 30b. The light receiving unit 20b includes an avalanche multiplying diode Db, a quenching element Qb formed of a p-channel MOS transistor, and an inverter circuit INVb. The signal generation unit 30b includes two T-flip-flop circuits FFb0 and FFb1 forming a two-bit counter circuit and switches SWb0 and SWb1 formed of n-channel MOS transistors.

The anode of the diode Db is connected to a reference voltage node (voltage VSS), and the cathode of the diode Db is connected to the drain of the p-channel MOS transistor forming the quenching element Qb. The source of the p-channel MOS transistor forming the quenching element Qb is connected to the power source voltage node (voltage VDD). The input terminal of the inverter circuit INVb is connected to the connection node between the diode Db and the quenching element Qb. The output terminal of the inverter circuit INVb, which is also the output terminal of the light receiving unit 20b, is connected to the input terminal T of the T-flip-flop circuit FFb0, which is the input terminal of the signal generation unit 30b.

The output terminal Q of the T-flip-flop circuit FFb0 is connected to the input terminal T of the T-flip-flop circuit FFb1. The connection node between the output terminal Q of the T-flip-flop circuit FFb0 and the input terminal T of the T-flip-flop circuit FFb1 is connected to the source of the n-channel MOS transistor forming the switch SWb0. The output terminal Q of the T-flip-flop circuit FFb1 is connected to the source of the n-channel MOS transistor forming the switch SWb1.

The gate of the p-channel MOS transistor forming the quenching element Qb is connected to a node of the voltage VQN. The gates of the n-channel MOS transistors forming the switches SWb0 and SWb1 are connected to the control line PVSEL. The drains of the n-channel MOS transistors forming the switches SWb0 and SWb1 are connected to the output line POUT. The clear terminals CLR of the T-flip-flop circuits FFb0 and FFb1 are connected to the vertical select circuit 3 and can be supplied with the control signal PCLR from the vertical select circuit 3.

The second pixel P2 is the same as the first pixel P1 except that the counter circuit forming the signal generation unit 30b is a two-bit counter circuit. The two-bit counter circuit in which the T-flip-flop circuits FFb0 to FFb1 are sequentially connected counts pulses of the signal PIXOUT supplied from the light receiving unit 20b. When turned on in response to a control signal supplied from the control line PVSEL, the switches SWb0 to SWb1 output the output signal of the counter circuit formed by the T-flip-flop circuits FFb0 to FFb1 to the output line POUT. The counter circuit formed of the T-flip-flop circuits FFb0 to FFb1 is configured to reset the counter output signal by using the control signal PCLR supplied from the vertical select circuit 3.

Figure 6:
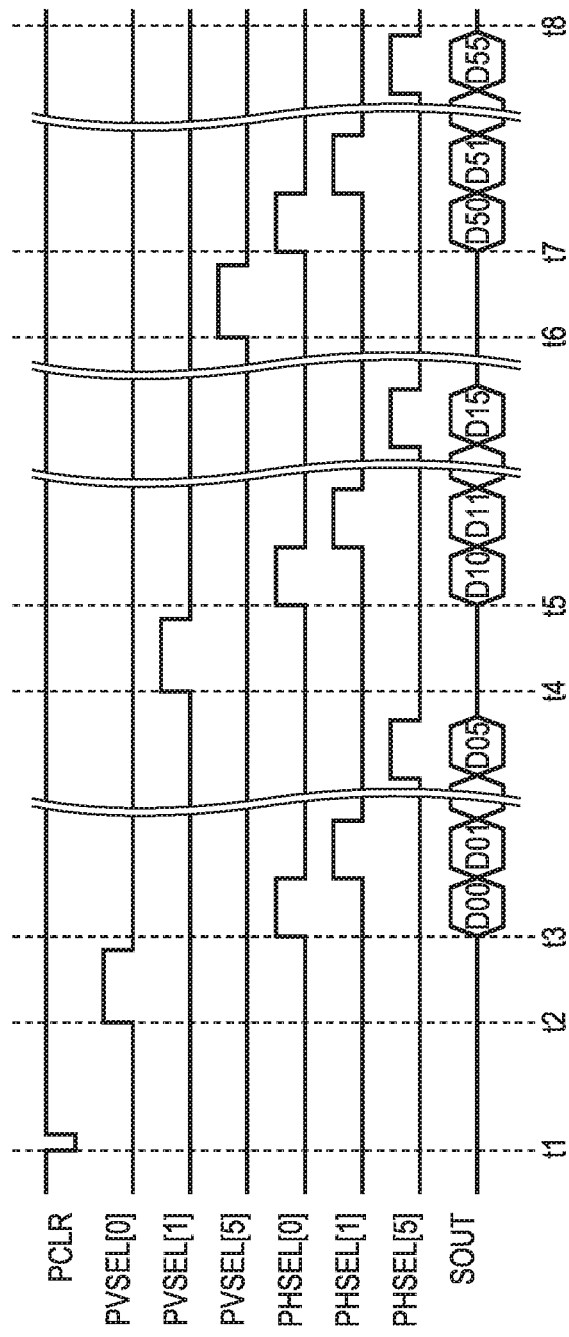
FIG. 6 is a timing chart illustrating a method of driving the photoelectric conversion device according to the first embodiment of the present invention.

Next, the operation of the photoelectric conversion device according to the present embodiment will be described by using FIG. 6. FIG. 6 is a timing chart illustrating the operation of the photoelectric conversion device according to the present embodiment. FIG. 6 illustrates the control signals PCLR, PVSEL[0], PVSEL[1], and PVSEL[5] supplied from the vertical select circuit 3, the control signals PHSEL[0], PHSEL[1], and PHSEL[5] supplied from the horizontal select circuit 5, and the output signal SOUT.

At time t1, the vertical select circuit 3 controls the control signal PCLR from a high level to a low level. Thereby, the counter output signals of all the unit pixels P including the first pixel P1 and the second pixel P2 are reset.

Next, in a period from the time when the control signal PCLR is controlled back to the high level to the time t2, the light receiving unit 20 of each unit pixel P outputs a signal PIXOUT including pulses, the number of which corresponds to the number of incident photons. The signal generation unit 30 of each unit pixel P then counts the number of pulses superimposed on the signal PIXOUT supplied from the light receiving unit 20.

Next, at the time t2, the vertical select circuit 3 controls the control signal PVSEL[0] from the low level to the high level and turns on the switches SWa0 to SWa3 or the switches SWb0 to SWb1 of the unit pixels P belonging to the 0th row. Thereby, a signal indicating a count value counted by the signal generation unit 30 of the unit pixel P on each column on the 0th row is output to the signal processing circuit 4 on the corresponding column via the output line POUT on the corresponding column. The signal processing circuit 4 on each column holds the signal output from the unit pixel P on the corresponding column.

Next, in a period from the time t3 after the control signal PVSEL[0] is controlled to the low level to the time t4, the horizontal select circuit 5 controls the control signals PHSEL[0], PHSEL[1], ..., PHSEL[5] corresponding to the signal processing circuit 4 on each column sequentially to the high level. Thereby, signals (data D00 to D05) held in the signal processing circuits 4 on respective columns are externally sequentially output as the output signal SOUT via the horizontal output line HSIG and the output circuit 6. Note that data D00 to D05 of the output signal SOUT correspond to the output of the unit pixels P00 to P55 in FIG. 1.

Then, in a similar manner to the operation of the period from the time t2 to the time t4, readout operations of signals from the unit pixels P belonging to the first row to the fifth row are sequentially performed on a row basis. For example, in the period from the time t4 to the time t6, signals read out from the unit pixels P on respective columns on the first row (data D10 to D15) are output sequentially as the output signal SOUT. Further, in the period from the time t6 to the time t8, signals read out from the unit pixels P on respective columns on the fifth row (data D50 to D55) are output sequentially as the output signal SOUT.

In such a way, the photoelectric conversion device 100 according to the present embodiment includes the first pixel P1 whose circuit size or layout area is relatively large and the second pixel P2 whose circuit size or layout area is relatively small. Appropriate selection of the first pixels P1 and the second pixels P2 as the plurality of unit pixels P forming the pixel region 10 enables reduction in the chip area or increase in the function.

For example, as described above, with the number of bits of the counter circuit of the signal generation unit 30b of the second pixel P2 being smaller than the number of bits of a counter circuit of the signal generation unit 30a of the first pixel P1, the circuit size or the layout area of the second pixel P can be relatively small. In such a case, as one example, the first pixels P1 can be arranged in the light receiving region 11, and the second pixels P2 can be arranged in the OB region 12. Because of substantially no light incidence, the second pixel P2 having the counter circuit with the smaller number of bits can be employed for the OB region 12. Therefore, for the reduction of the layout area of the unit pixels P arranged in the OB region 12, it is possible to reduce the chip area, enhance the function by increasing the number of effective pixels or adding a new circuit, or the like.

Figure 7:
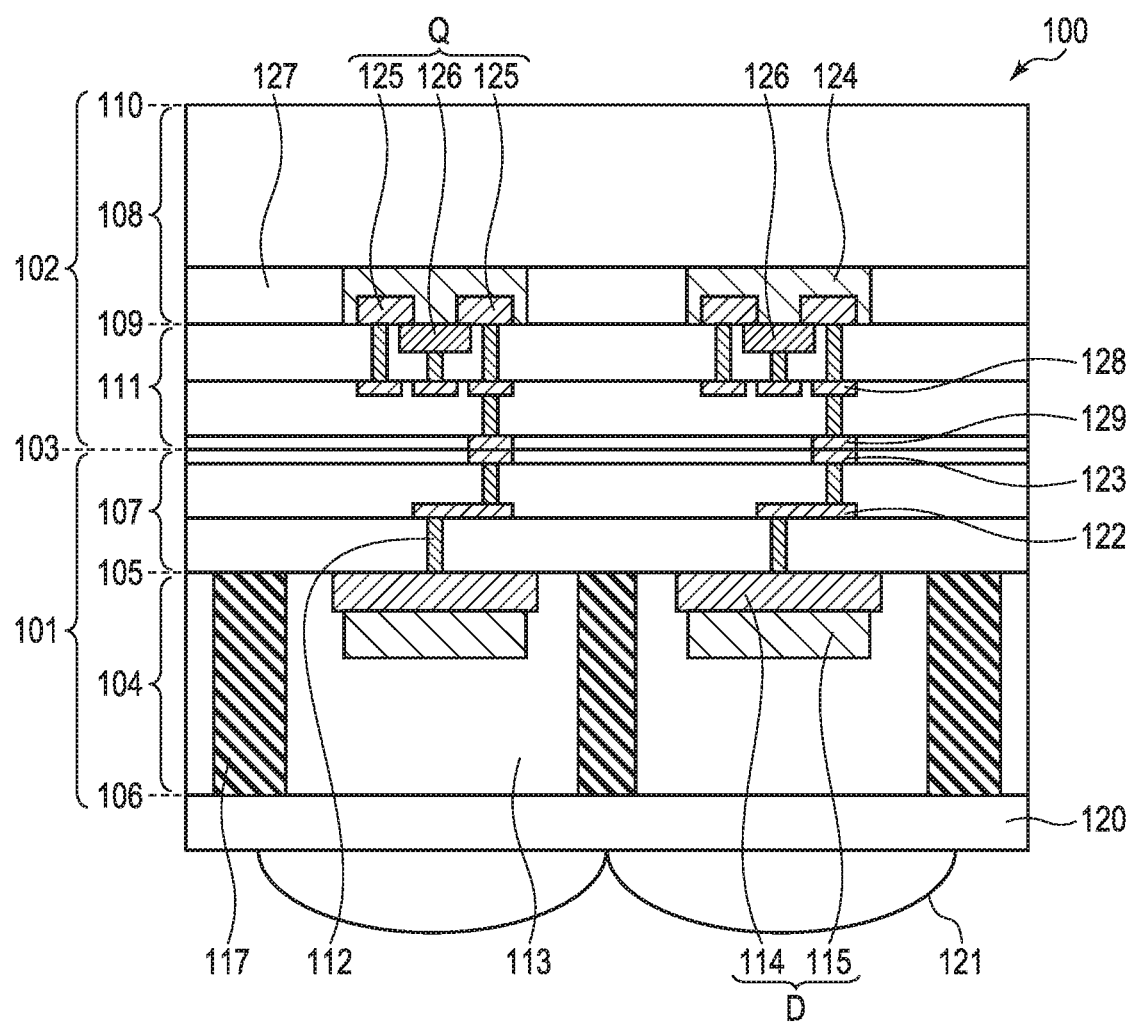
FIG. 7 is a schematic cross-sectional view of the photoelectric conversion device according to the first embodiment of the present invention.

Next, a specific configuration example of the photoelectric conversion device 100 according to the present embodiment will be described by using FIG. 7. FIG. 7 is a schematic cross-sectional view illustrating the structure of the photoelectric conversion device according to the present embodiment. FIG. 7 illustrates the cross-sectional structure for two pixels corresponding to the unit pixels P of FIG. 1.

The photoelectric conversion device 100 includes a first chip 101 and a second chip 102. The first chip 101 and the second chip 102 are joined at a junction interface 103. In the first chip 101, the diode D out of the components of the unit pixel P is arranged. In the second chip 102, components other than the diode D of the unit pixel P out of the components of the unit pixel P, that is, the quenching element Q, the inverter circuit INV, and the signal generation unit 30 are arranged. FIG. 7 illustrates only the diode D and the quenching element Q out of the above components of the unit pixel P.

The first chip 101 has a first substrate 104. The first substrate 104 has a primary face 105, which is a face on the junction interface 103 side, and a backside face 106, which is a face on the side opposite thereto. Inside the first substrate 104, wells 113 and element isolation regions 117 that isolates the wells 113 from each other are provided. The diode D formed by a p-n junction between an n-type region 114 in contact with the primary face 105 and a p-type region 115 in contact with the bottom of the n-type region 114 is provided on the primary face 105 side inside the well 113. A multilevel interconnection structure 107 including an interconnection layer 122 and an interconnection layer 123 is provided on the primary face 105 of the first substrate 104. Contact plugs 112 made of tungsten, for example, provide electrical connection between the diode D and the interconnection layer 122 and between the interconnection layer 122 and the interconnection layer 123. A color filter layer 120 including a planarization layer or the like and a micro lens 121 are provided on the backside face 106 of the first substrate 104.

The second chip 102 has a second substrate 108. The second substrate 108 has a primary face 109, which is a face on the junction interface 103 side, and a backside face 110, which is a face opposite thereto. On the primary face 109 side inside the second substrate 108, wells 124 and element isolation regions 127 that isolates the wells 124 from each other are provided. In the well 124, a p-channel MOS transistor including a source/drain region 125 and a gate electrode 126 to form the quenching element Q is provided. A multilayer wring structure 111 including an interconnection layer 128 and an interconnection layer 129 is provided on the primary face 109 of the second substrate 108. Contact plugs 112 made of tungsten, for example, provide electrical connection between each terminal of the quenching element Q and the interconnection layer 128 and between the interconnection layer 128 and the interconnection layer 129.

The first chip 101 and the second chip 102 are attached to each other such that the interconnection 123 in the uppermost layer of the first chip 101 and the interconnection layer 129 in the uppermost layer of the second chip 102 are electrically connected at the junction interface 103.

In such a way, the photoelectric conversion device 100 according to the present embodiment can be configured as a backside illumination type photoelectric conversion device that guides an incident light from the backside face 106 side of the first substrate 104 to the diode D via the micro lens 121 and the color filter layer 120. However, the photoelectric conversion device 100 according to the present embodiment is not necessarily required to be the backside illumination type photoelectric conversion device and may be a front-side illumination type photoelectric conversion device.

As discussed above, according to the present embodiment, it is possible to realize enhancement of the function of a photoelectric conversion device without increasing the size of a pixel circuit.

Second Embodiment

Figure 8:
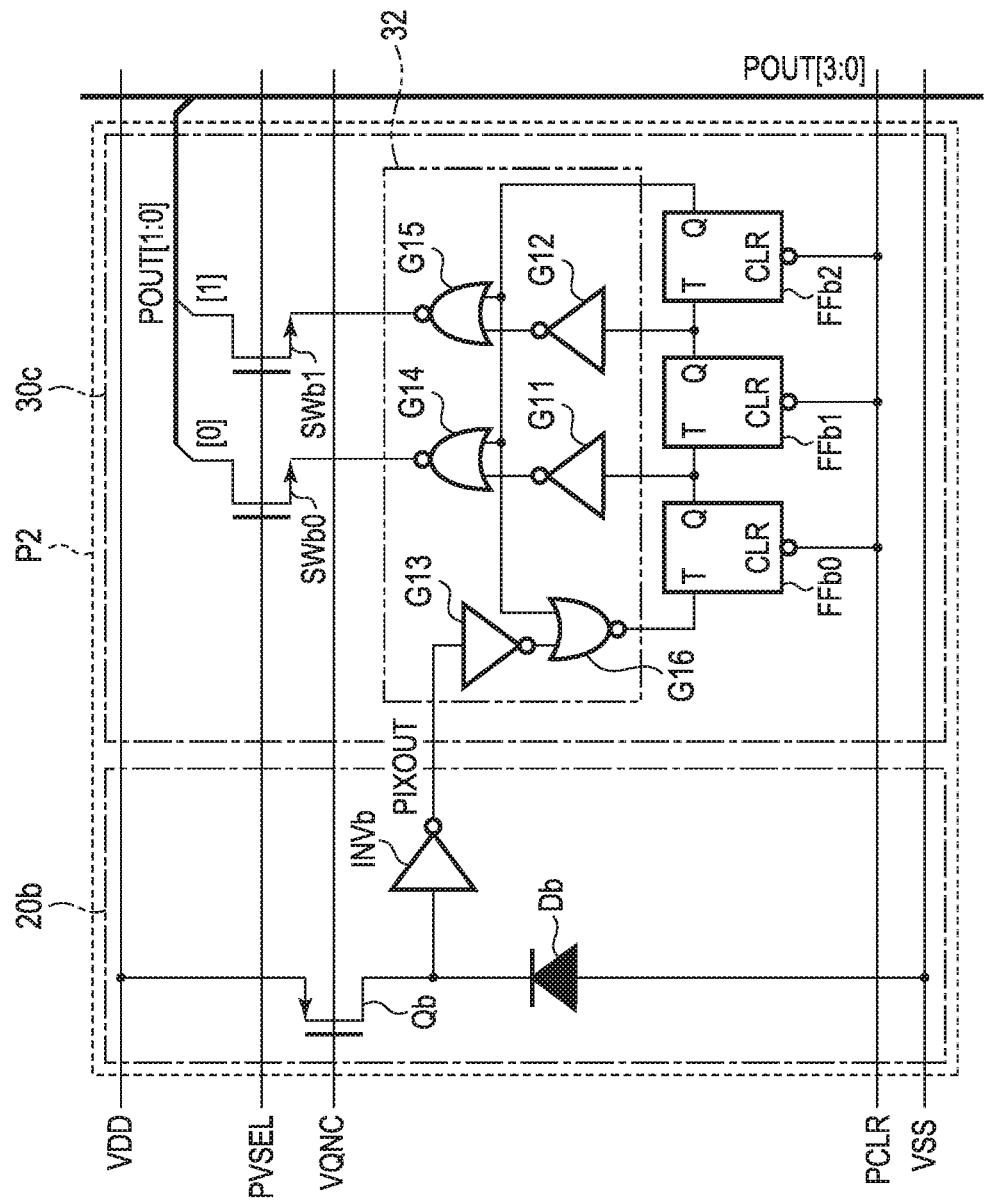
FIG. 8 is a circuit diagram illustrating a configuration example of a second pixel of a photoelectric conversion device according to a second embodiment of the present invention.

A photoelectric conversion device according to a second embodiment of the present invention will be described with reference to FIG. 8. The same components as those of the photoelectric conversion device according to the first embodiment will be labeled with the same references, and the description thereof will be omitted or simplified. FIG. 8 is a circuit diagram illustrating a configuration example of the second pixel of the photoelectric conversion device according to the present embodiment.

In the present embodiment, another configuration example of the second pixel P2 will be described. Other elements are the same as those of the photoelectric conversion device according to the first embodiment.

As illustrated in FIG. 8, the second pixel P2 of the photoelectric conversion device according to the present embodiment includes the light receiving unit 20b and a signal generation unit 30c. The light receiving unit 20b is the same as the light receiving unit 20b of the second pixel P2 of the photoelectric conversion device according to the first embodiment illustrated in FIG. 5. The signal generation unit 30c includes three T-flip-flop circuits FFb0, FFb1, and FFb2 forming a three-bit counter circuit, an operational circuit 32, and switches SWb0 and SWb1 formed of n-channel MOS transistors. The operational circuit 32 includes NOT gates G11, G12, and G13 and NOR gates G14, G15, and G16.

The output terminal of the inverter circuit INVb, which is also the output terminal of the light receiving unit 20b, is connected to the input terminal of the NOT gate G13, which is the input terminal of the signal generation unit 30c. The output terminal of the NOT gate G13 is connected to one of the input terminals of the NOR gate G16. The output terminal of the NOR gate G16 is connected to the input terminal T of the T-flip-flop circuit FFb0. The output terminal Q of the T-flip-flop circuit FFb0 is connected to the input terminal T of the T-flip-flop circuit FFb1. The connection node between the output terminal Q of the T-flip-flop circuit FFb0 and the input terminal T of the T-flip-flop circuit FFb1 is connected to the input terminal of the NOT gate G11. The output terminal of the NOT gate G11 is connected to one of the input terminals of the NOR gate G14. The output terminal of the NOR gate G14 is connected to the source of the n-channel MOS transistor forming the switch SWb0.

The output terminal Q of the T-flip-flop circuit FFb1 is connected to the input terminal T of the T-flip-flop circuit FFb2. The connection node of the output terminal Q of the T-flip-flop circuit FFb1 and the input terminal T of the T-flip-flop circuit FFb2 is connected to the input terminal of the NOT gate G12. The output terminal of the NOT gate G12 is connected to one of the input terminals of the NOR gate G15. The output terminal of the NOR gate G15 is connected to the source of the n-channel MOS transistor forming the switch SWb1. The output terminal Q of the T-flip-flop circuit FFb2 is connected to the other input terminals of the NOR gates G14, G15, and G16, respectively.

The gates of the n-channel MOS transistors forming the switches SWb0 and SWb1 are connected to the control line PVSEL. The drains of the n-channel MOS transistors forming the switches SWb0 and SWb1 are connected to the output line POUT. The clear terminals CLR of the T-flip-flop circuits FFb0, FFb1, and FFb2 are connected to the vertical select circuit 3 and can be supplied with the control signal PCLR from the vertical select circuit 3.

The three-bit counter circuit in which the T-flip-flop circuits FFb0, FFb1, and FFb2 are sequentially connected counts pulses superimposed on the signal PIXOUT supplied from the light receiving unit 20b via the NOT gate G13 and the NOR gate G16. When the output Q of the T-flip-flop circuit FFb2 is at a low level, the NOR gate G16 outputs a pulse supplied from the light receiving unit 20b to the T-flip-flop circuit FFb1.

When the output Q of the T-flip-flop circuit FFb2 is at a low level, the NOR gate G14 directly outputs the output Q of the T-flip-flop circuits FFb0, which is the 0th bit count value. Further, when the output Q of the T-flip-flop circuit FFb2 is at a high level, the NOR gate G14 outputs 0 as the 0th bit counter value.

Similarly, when the output Q of the T-flip-flop circuit FFb2 is at a low level, the NOR gate G15 directly outputs the output Q of the T-flip-flop circuits FFb1, which is the first bit count value. Further, when the output Q of the T-flip-flop circuit FFb2 is at a high level, the NOR gate G15 outputs 0 as the first bit counter value.

That is, the operational circuit 32 compares an output value of the counter circuit formed of the T-flip-flop circuits FFb0, FFb1, and FFb2 with a predetermined threshold value and, when the threshold value is exceeded, operates to replace the output value with a predetermined substitute value that is less than or equal to the threshold value. More specifically, the operational circuit 32 is configured such that, when the count value of the three-bit counter circuit formed of the T-flip-flop circuits FFb0, FFb1, and FFb2 is greater than or equal to 5, the count value output from the counter circuit is 0.

When the second pixels P2 of the present embodiment are arranged in the OB region 12, the functions provided by the operational circuit 32 described above can be utilized as a correction function for a damaged pixel. For example, when the number of output pulses of the light receiving unit 20b exceeds a certain value (threshold value) due to a defect of the diode Db, it can be configured to output 0 corresponding to a black level as pixel output. The threshold value can be set based on the determination criterion for a defective pixel.

As described in the first embodiment, the counter circuit of the second pixel P2 is configured to have a smaller circuit size or a smaller layout area than the first pixel P1. It is therefore possible to suppress increase in the circuit size of the layout area while adding the operational circuit 32 to the second pixel P2 to enhance the function.

Note that the threshold value of the counter circuit is set to 5 and the substitute value is set to 0, and the pixel output is 0 when the number of photons entering the light receiving unit 20b is greater than or equal to 5 in the signal generation unit 30c illustrated in FIG. 8. However, the threshold value and the substitute value of the output in the counter circuit are not limited to the above and can be suitably changed.

As discussed above, according to the present embodiment, it is possible to realize enhancement of the function of a photoelectric conversion device while suppressing an increase in the size of a pixel circuit.

Third Embodiment

Figure 9:
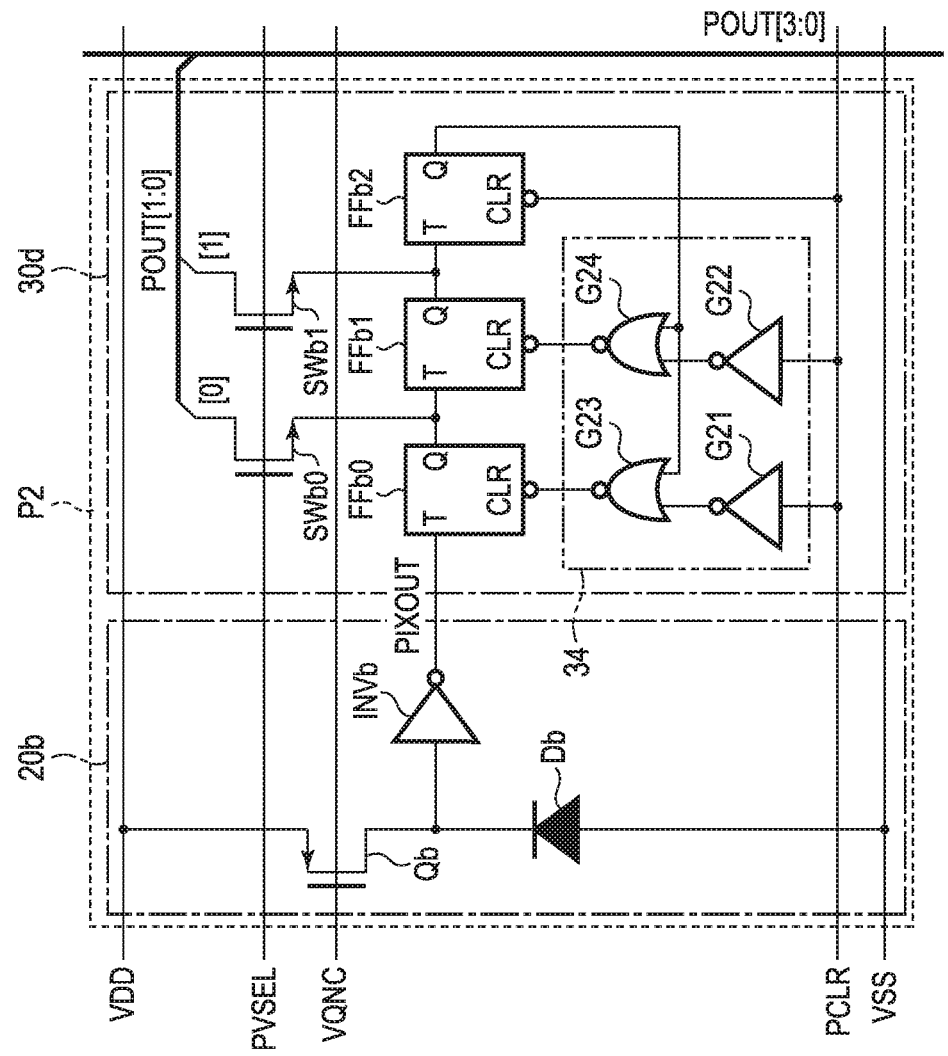
FIG. 9 is a circuit diagram illustrating a configuration example of a second pixel of a photoelectric conversion device according to a third embodiment of the present invention.

A photoelectric conversion device according to a third embodiment of the present invention will be described with reference to FIG. 9. The same components as those of the photoelectric conversion devices according to the first and second embodiments will be labeled with the same references, and the description thereof will be omitted or simplified. FIG. 9 is a circuit diagram illustrating a configuration example of the second pixel of the photoelectric conversion device according to the present embodiment.

In the present embodiment, another configuration example of the second pixel P2 will be described. Other elements are the same as those of the photoelectric conversion device according to the first embodiment.

As illustrated in FIG. 9, the second pixel P2 of the photoelectric conversion device according to the present embodiment includes the light receiving unit 20b and a signal generation unit 30d. The light receiving unit 20b is the same as the light receiving unit 20b of the second pixel P2 of the photoelectric conversion device according to the first embodiment illustrated in FIG. 5. The signal generation unit 30d includes three T-flip-flop circuits FFb0, FFb1, and FFb2 forming a three-bit counter circuit, an operational circuit 34, and switches SWb0 and SWb1 formed of n-channel MOS transistors. The operational circuit 34 includes NOT gates G21 and G22 and NOR gates G23 and G24.

The output terminal of the inverter circuit INVb, which is also the output terminal of the light receiving unit 20b, is connected to the input terminal T of the T-flip-flop circuit FFb0, which is the input terminal of the signal generation unit 30d. The output terminal Q of the T-flip-flop circuit FFb0 is connected to the input terminal T of the T-flip-flop circuit FFb1. The connection node between the output terminal Q of the T-flip-flop circuit FFb0 and the input terminal T of the T-flip-flop circuit FFb1 is connected to the source of the n-channel MOS transistor forming the switch SWb0. The output terminal Q of the T-flip-flop circuit FFb1 is connected to the input terminal T of the T-flip-flop circuit FFb2. The connection node between the output terminal Q of the T-flip-flop circuit FFb1 and the input terminal T of the T-flip-flop circuit FFb2 is connected to the source of the n-channel MOS transistor forming the switch SWb1. The output terminal Q of the T-flip-flop circuit FFb2 is connected to ones of the input terminals of the NOR gates G23 and G24, respectively.

The gates of the n-channel MOS transistors forming the switches SWb0 and SWb1 are connected to the control line PVSEL. The drains of the n-channel MOS transistors forming the switches SWb0 and SWb1 are connected to the output line POUT.

The output terminal of the NOT gate G21 is connected to the other input terminal of the NOR gate G23. The output terminal of the NOR gate G23 is connected to the clear terminal CLR of the T-flip-flop circuit FFb0. Further, the output terminal of the NOT gate G22 is connected to the other input terminal of the NOR gate G24. The output terminal of the NOR gate G24 is connected to the clear terminal CLR of the T-flip-flop circuit FFb1. The input terminals of the NOT gates G21 and G22 are connected to the vertical select circuit 3 and can be supplied with the control signal PCLR from the vertical select circuit 3. Further, the clear terminal CLR of the T-flip-flop circuit FFb2 is connected to the vertical select circuit 3 and can be supplied with the control signal PCLR from the vertical select circuit 3.

The three-bit counter circuit in which the T-flip-flop circuits FFb0, FFb1, and FFb2 are sequentially connected counts pulses superimposed on the signal PIXOUT supplied from the light receiving unit 20a. When turned on in response to the control signal supplied from the control line PVSEL, the switches SWb0 to SWb1 output the value of the least significant two bits of the counter circuit formed by the T-flip-flop circuits FFb0 to FFb1 to the output line POUT as an output signal.

The operational circuit 34 is configured to reset the T-flip-flop circuits FFb0 and FFb1 in accordance with the control signal PCLR and the output of the T-flip-flop circuit FFb2. Specifically, the operational circuit 34 resets the T-flip-flop circuits FFb0 and FFb1 when one of the control signal PCLR and the output of the T-flip-flop circuit FFb2 is at the high level and the other is at the low level.

That is, the operational circuit 34 is configured such that, when the count value of the counter circuit formed of the T-flip-flop circuits FFb0, FFb1, and FFb2 is greater than or equal to 5, the count value output from the counter circuit is 0 as with the operational circuit 32 of the second embodiment.

When the second pixels P2 of the present embodiment are arranged in the OB region 12, the functions of the operational circuit 34 described above can be utilized as a correction function for a damaged pixel. For example, when the number of output pulses of the light receiving unit 20b exceeds a certain value due to a defect of the diode Db, it can be configured to output 0 corresponding to a black level as pixel output. It is therefore possible to suppress increase in the circuit size or the layout area while adding the operational circuit 32 to the second pixel P2 to enhance the function in a similar manner to the case of the second embodiment.

Note that the threshold value of the counter circuit is set to 5 and the substitute value is set to 0, and the pixel output is 0 when the number of photons entering the light receiving unit 20b is greater than or equal to 5 in the signal generation unit 30d illustrated in FIG. 9. However, the threshold value in the counter circuit is not limited to the above and can be suitably changed.

As discussed above, according to the present embodiment, it is possible to realize enhancement of the function of a photoelectric conversion device while suppressing an increase in the size of a pixel circuit.

Fourth Embodiment

A photoelectric conversion device according to a fourth embodiment of the present invention will be described with reference to FIG. 10 and FIG. 11. The same components as those of the photoelectric conversion devices according to the first to third embodiments will be labeled with the same references, and the description thereof will be omitted or simplified.

While examples in which the second pixels P2 are applied as the unit pixels P arranged in the OB region 12 have been illustrated in the first to third embodiments, application of the second pixel P2 is not limited to the pixel unit P arranged in the OB region 12. In the present embodiment, an example in which, when the unit pixels P include a plurality of sub-pixels for ranging (focus detection), these sub-pixels are formed of the second pixels P2 will be described. A light receiving unit of a sub-pixel has a smaller area than the light receiving unit of the first pixel P1 in a plan view.

Figure 10:
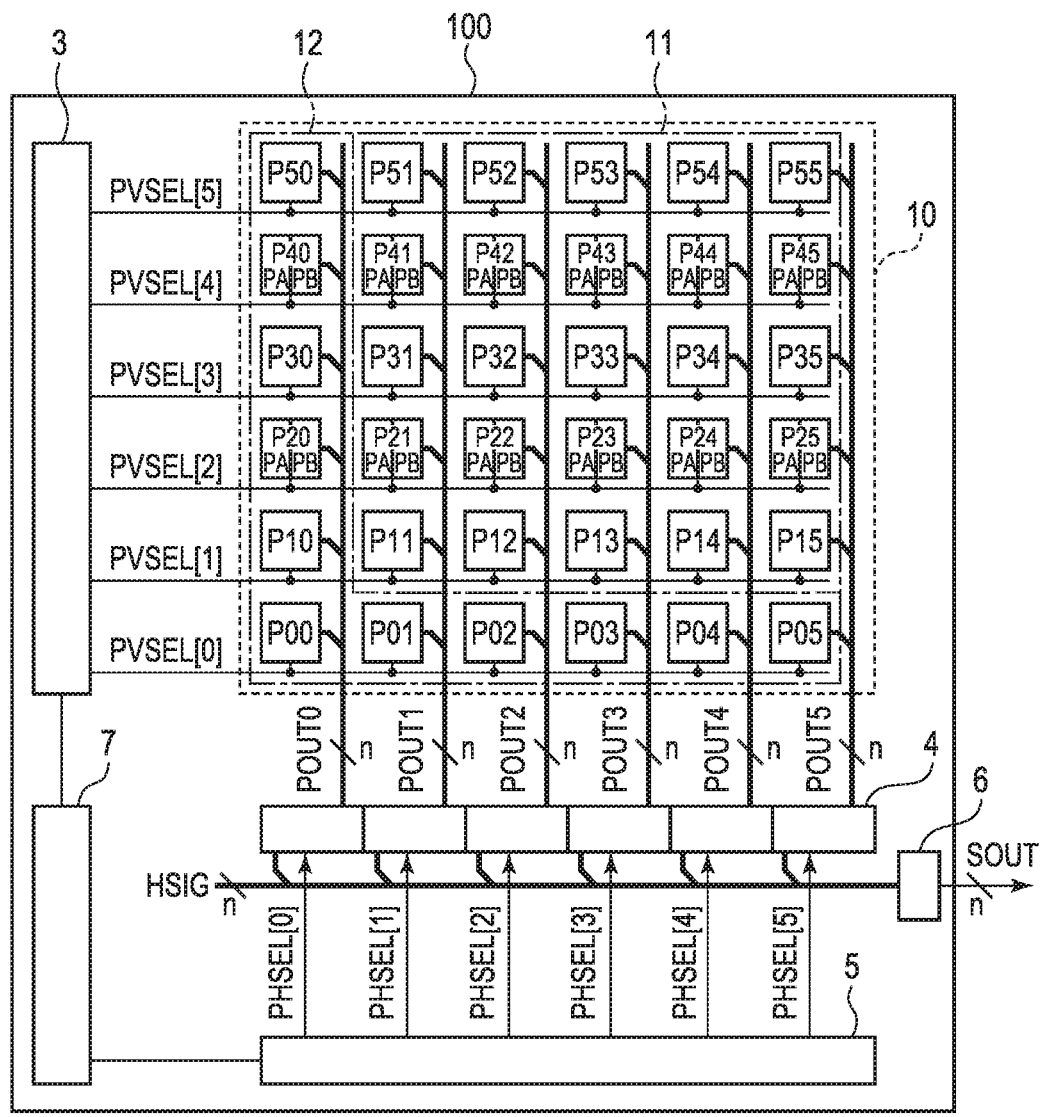
FIG. 10 is a block diagram illustrating a general configuration of a photoelectric conversion device according to a fourth embodiment of the present invention.

FIG. 10 is a block diagram illustrating a general configuration of a photoelectric conversion device according to the present embodiment. As illustrated in FIG. 10, the basic configuration of the photoelectric conversion device 100 according to the present embodiment is the same as that of the photoelectric conversion device according to the first embodiment. The photoelectric conversion device 100 according to the present embodiment is different from the photoelectric conversion device according to the first embodiment in that some of the unit pixels P forming the pixel region 10 include a plurality of sub-pixels used for ranging. FIG. 10 illustrates an example in which each of the unit pixels P arranged on the second row and the fourth row is formed of two sub-pixels PA and PB used for ranging. The number of sub-pixels used for ranging is not necessarily required to be two but may be three or greater.

The photoelectric conversion device 100 includes an optical system (not illustrated) configured to cause a phase difference between an image projected onto the sub-pixel PA and an image projected onto the sub-pixel PB and can obtain a distance to a subject by using a principle of triangulation. In the photoelectric conversion device 100 of the pixel configuration illustrated in FIG. 10, the unit pixels P arranged on the 0th row, the first row, the third row, and the fifth row may be formed of the first pixels P1, and the sub-pixels PA and PB of the unit pixels P arranged on the second row and the fourth row may be formed of the second pixels P2.

That is, the photoelectric conversion device 100 according to the present embodiment has an imaging region in which a plurality of first pixels as pixels used for imaging are arranged and a focus detection region in which a plurality of second pixels as pixels used for ranging are arranged.

Figure 11:
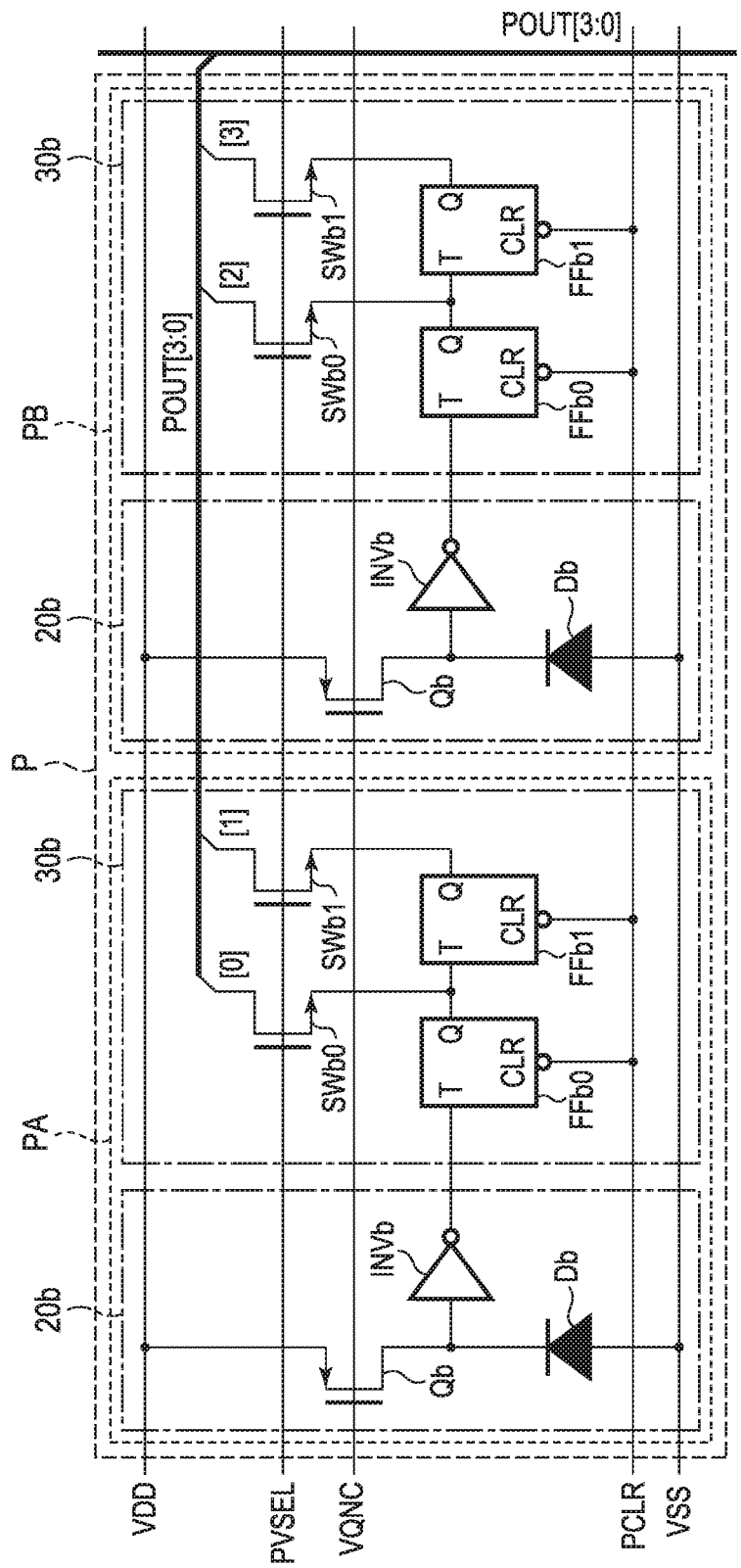
FIG. 11 is a circuit diagram illustrating a configuration example of a second pixel of a photoelectric conversion device according to the fourth embodiment of the present invention.

FIG. 11 is a circuit diagram illustrating a configuration example of the unit pixel P including the sub-pixels PA and PB in the photoelectric conversion device according to the present embodiment. As illustrated in FIG. 11, each of the sub-pixel PA and the sub-pixel PB has the same circuit configuration as the second pixel P2 illustrated in FIG. 5. The control line PVSEL is a signal line common to the sub-pixels PA and PB. In the case of the circuit configuration of FIG. 11, the unit pixel P including the sub-pixels PA and PB can be configured to output, to the output line POUT, a four-bit signal in which the output from the sub-pixel PA corresponds to the least significant two bits and the output from the sub-pixel PB corresponds to the most significant two bits.

The unit pixel P used for imaging and the unit pixel P used for ranging often have substantially the same pixel area, as illustrated in FIG. 10, for example. Thus, a planar light receiving region of the sub-pixel PA and the sub-pixel PB forming the unit pixel P used for ranging is less than or equal to half the planar light receiving region of the unit pixel P used for imaging (the first pixel P1), the light receiving sensitivity of the sub-pixels PA and PB is lower than the light receiving sensitivity of the unit pixel P used for imaging.

Therefore, the second pixel P2 whose upper limit value of the output signal is relatively low can be applied to the sub-pixel PA and the sub-pixel PB of the unit pixel P used for ranging. Thereby, it is possible to realize enhancement of the function that adds the function of acquisition of signals necessary for distance measurement while suppressing an increase in the size of a pixel circuit.

As discussed above, according to the present embodiment, it is possible to realize enhancement of the function of a photoelectric conversion device while suppressing an increase in the size of a pixel circuit.

Fifth Embodiment

Figure 12:
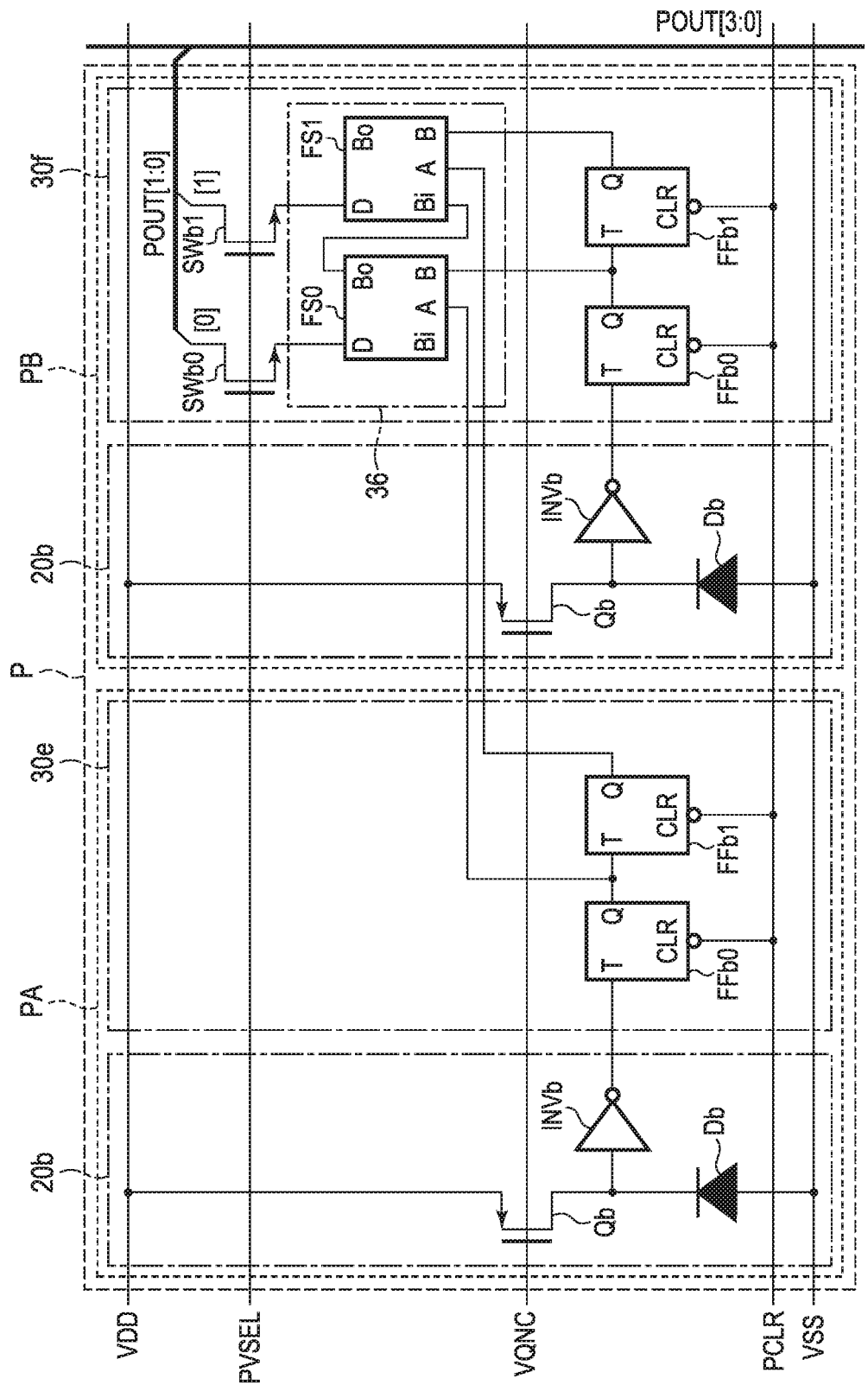
FIG. 12 is a circuit diagram illustrating a configuration example of a second pixel of a photoelectric conversion device according to a fifth embodiment of the present invention.
Figures 13A, 13B:
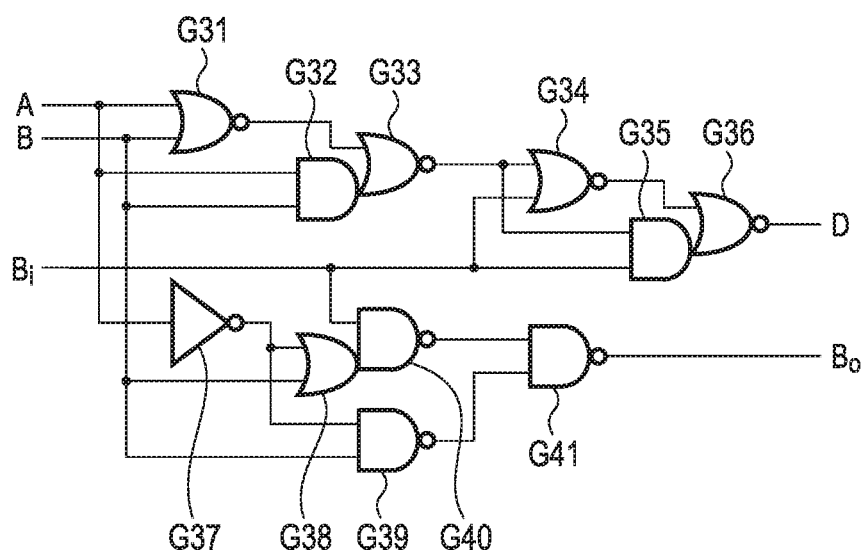
FIG. 13A is a truth table illustrating the operation of a full-subtractor.
FIG. 13B is a circuit diagram illustrating the operation of the full-subtractor.

A photoelectric conversion device according to a fifth embodiment of the present invention will be described with reference to FIG. 12 to FIG. 13B. The same components as those of the photoelectric conversion devices according to the first to fourth embodiments will be labeled with the same references, and the description thereof will be omitted or simplified. FIG. 12 is a circuit diagram illustrating the configuration example of the unit pixel P used for ranging in the photoelectric conversion device according to the present embodiment. FIG. 13A is a truth table illustrating the operation of a full-subtractor. FIG. 13B is a circuit diagram illustrating the operation of the full-subtractor.

In the present embodiment, another configuration example of the unit pixel P used for ranging will be illustrated. As illustrated in FIG. 12, the unit pixel P used for ranging in the photoelectric conversion device according to the present embodiment includes the sub-pixel PA having the light receiving unit 20b and a signal generation unit 30e and the sub-pixel PB having the light receiving unit 20b and a signal generation unit 30f. The light receiving unit 20b of the sub-pixel PA and the sub-pixel PB are the same as that of the fourth embodiment. The signal generation unit 30e of the sub-pixel PA includes two T-flip-flop circuits FFb0 and FFb1 forming a two-bit counter circuit. The signal generation unit 30f of the sub-pixel PB includes two T-flip-flop circuits FFb0 and FFb1 forming a two-bit counter circuit, an operational circuit 36, and switches SWb0 and SWb1 formed of re-channel MOS transistors. The operational circuit 36 is a two-bit parallel subtractor including full-subtractors FS0 and FS1. The full-subtractors FS0 and FS1 have three input terminals A (minuend), B (subtrahend), and Bi (borrow input) and two output terminals D (difference) and Bo (borrow output).

The connection node of the output terminal Q of the T-flip-flop circuit FFb0 of the signal generation unit 30e and the input terminal T of the T-flip-flop circuit FFb1 is connected to the input terminal A of the full-subtractor FS0.

The output terminal Q of the T-flip-flop circuit FFb1 of the signal generation unit 30e is connected to the input terminal A of the full-subtractor FS1. The connection node of the output terminal Q of the T-flip-flop circuit FFb0 of the signal generation unit 30f and the input terminal T of the T-flip-flop circuit FFb1 is connected to the input terminal B of the full-subtractor FS0. The output terminal Q of the T-flip-flop circuit FFb1 of the signal generation unit 30f is connected to the input terminal B of the full-subtractor FS1. The output terminal Bo of the full-subtractor FS0 is connected to the input terminal Bi of the full-subtractor FS1. The output terminal D of the full-subtractor FS0 is connected to the source of the n-channel MOS transistor forming the switch SWb0. The output terminal D of the full-subtractor FS1 is connected to the source of the n-channel MOS transistor forming the switch SWb1.

Each of the full-subtractors FS0 and FS1 operates as illustrated in the truth table of FIG. 13A. Here, the output from the counter circuit of the signal generation unit 30e is denoted as A, the 0th bit value of the output A is denoted as A0, and the first bit value of the output A is denoted as A1. Further, the output from the counter circuit of the signal generation unit 30f is denoted as B, the 0th bit value of the output B is denoted as B0, and the first bit value of the output B is denoted as B1. Further, the output of the full-subtractor FS0 is denoted as D0, and the output of the full-subtractor FS1 is denoted as D1. In this case, the output D0 of the full-subtractor FS0 will be D0=A0−B0. Further, the output D0 of the full-subtractor FS1 will be D1=A1−B1−Bi(=Bo). FIG. 13B is a circuit diagram illustrating an example of a circuit forming each of the full-subtractors FS0 and FS1. The full-subtractors FS0 and FS1 can be formed of the logic gates G31 to G41 illustrated in FIG. 13B, for example.

Thereby, the operational circuit 36 outputs a differential value between the output A and the output B, that is, a value resulted by subtracting the output B of the counter circuit of the signal generation unit 30f from the output A of the counter circuit of the signal generation unit 30e. The 0th bit value of the output from the operational circuit 36 is D0, and the first bit value of the output from the operational circuit 36 is D1.

Thereby, the unit pixel P used for ranging can output, to the output line POUT, a differential signal resulted by subtracting the output B of the sub-pixel PB from the output A of the sub-pixel PA in response to the control signal PVSEL from the vertical select circuit 3. The differential signal between the output A and the output B represents a phase difference between a subject image obtained from the sub-pixel PA and a subject image obtained from the sub-pixel PB and therefore can be utilized to calculate the distance to a subject. The photoelectric conversion device according to the present embodiment also outputs a differential signal of a counter circuit corresponding to the phase difference between a subject image obtained from the sub-pixel PA and a subject image obtained by a sub-pixel PB, which has a more enhanced function than the photoelectric conversion device according to the fourth embodiment.

As discussed above, according to the present embodiment, it is possible to realize enhancement of the function of a photoelectric conversion device while suppressing an increase in the size of a pixel circuit.

Sixth Embodiment

An imaging system according to a sixth embodiment of the present invention will be described by using FIG. 14.

Figure 14:
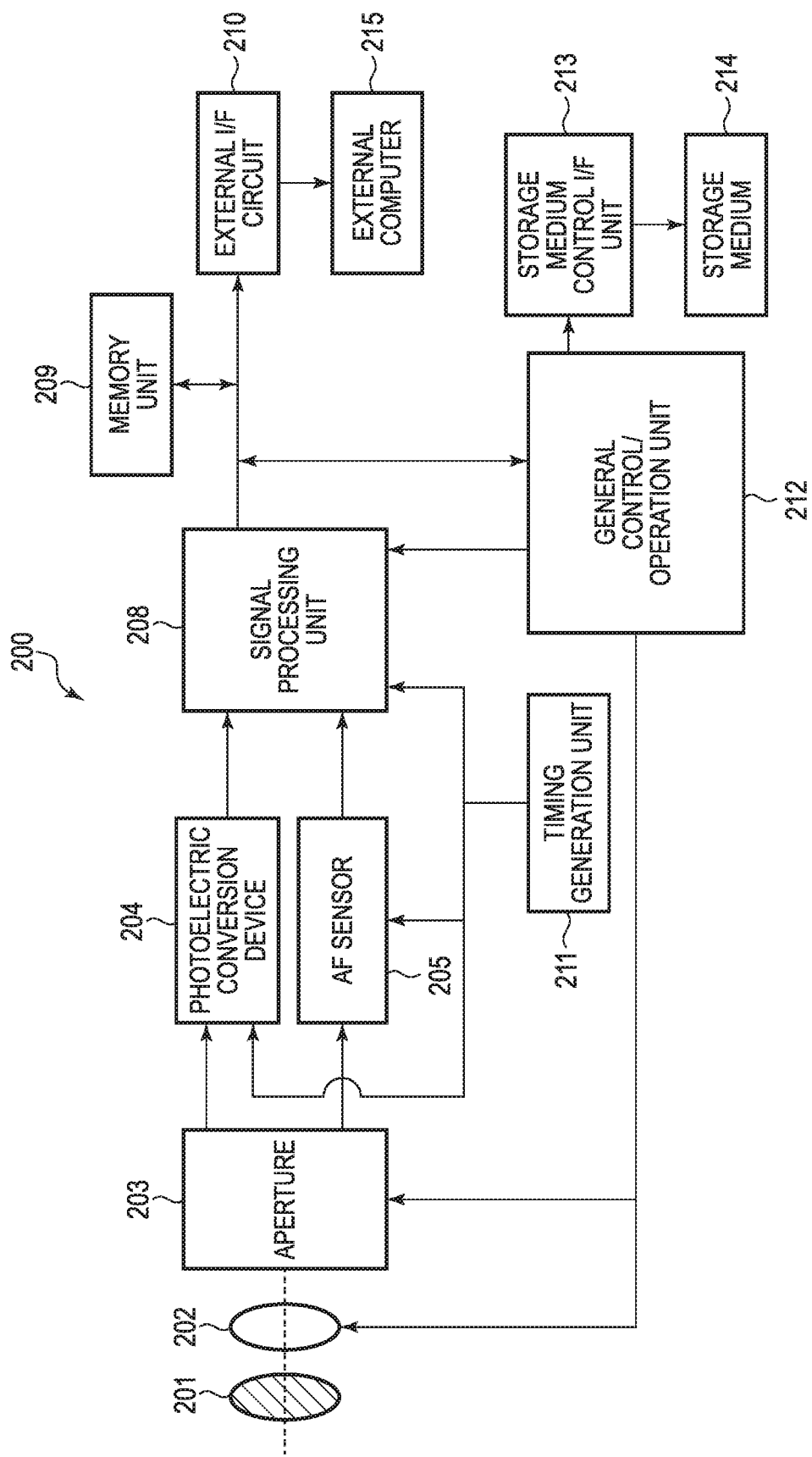
FIG. 14 is a block diagram illustrating a general configuration of an imaging system according to a sixth embodiment of the present invention.

FIG. 14 is a block diagram illustrating a configuration example of the imaging system according to the present embodiment.

As illustrated in FIG. 14, an imaging system 200 according to the present embodiment includes a barrier 201, a lens 202, an aperture 203, a photoelectric conversion device 204, and an AF sensor 205. The lens 202 is an optical system for capturing an optical image of a subject. The barrier 201 is provided for protecting the lens 202. The aperture 203 is provided for adjusting a light amount passing through the lens 202. The photoelectric conversion device 204 is configured by using the photoelectric conversion device 100 described in the first to fifth embodiments and is provided for acquiring an optical image of a subject captured by the lens 202 as an image signal. The AF sensor 205 is provided for acquiring signals necessary for focus detection. Note that, when the photoelectric conversion device 204 is formed of the photoelectric conversion device 100 according to the fourth or fifth embodiment, the AF sensor 205 is not necessarily required to be provided because signals necessary for focus detection is acquired from the photoelectric conversion device 204.

Further, the imaging system 200 includes a signal processing unit 208. The signal processing unit 208 is provided for performing processing on a signal output from the photoelectric conversion device 204 or the AF sensor 205 or processing of various correction or data compression on the obtained image data.

Further, the imaging system 200 includes a memory unit 209, an external I/F circuit 210, a timing generation unit 211, a general control/operation unit 212, and a storage medium control I/F unit 213. The memory unit 209 is provided for temporarily storing image data therein. The external I/F circuit 210 is provided for communicating with an external device such as an external computer 215. The timing generation unit 211 is provided for outputting various timing signals to the signal processing unit 208 or the like. The general control/operation unit 212 is provided for controlling various operations and the entire camera. The storage medium control I/F unit 213 is provided for transmitting and receiving data to and from a removable storage medium 214 such as a semiconductor memory used for storing acquired image data or reading out image data.

Once the barrier 201 is opened, an optical image from a subject enters the AF sensor 205 via the lens 202 and the aperture 203. The general control/operation unit 212 calculates a distance to a subject by using the scheme of phase difference detection as described above based on output signals from the AF sensor 205. The general control/operation unit 212 then performs autofocus control to drive the lens 202 based on the operation result, again determine whether or not focusing is obtained on the imaging surface, and when it is determined that no focusing is obtained, again drive the lens 202.

Next, after focusing is confirmed, a charge accumulation operation by the photoelectric conversion device 204 is started. Upon the completion of the charge accumulation operation by the photoelectric conversion device 204, an image signal output from the photoelectric conversion device 204 is written to the memory unit 209 by the general control/operation unit 212 via the signal processing unit 208.

Then, data accumulated in the memory unit 209 is stored in the storage medium 214 via the storage medium control OF unit 213 under the control of the general control/ operation unit 212. Alternatively, data accumulated in the memory unit 209 may be directly input to the external computer 215 or the like via the external I/F circuit 210.

As illustrated in the first to fifth embodiments, with the use of the photoelectric conversion device 100 illustrated in the above embodiments, it is possible to achieve an enhanced function while suppressing an increase in the size of a pixel circuit. Therefore, according to the imaging system of the present embodiment using the photoelectric conversion device 204, a higher quality image can be acquired.

Seventh Embodiment

Figure 15A:
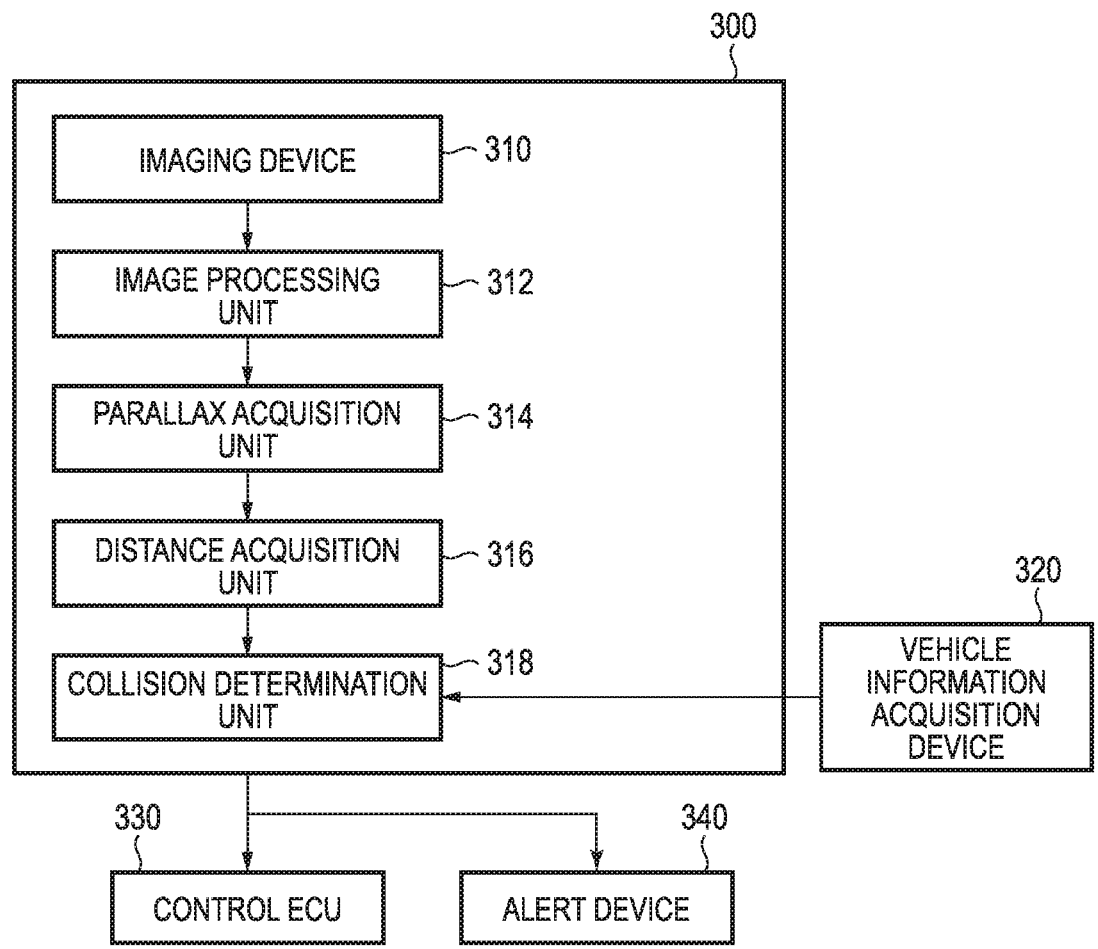
FIG. 15A is a diagram illustrating a configuration example of an imaging system according to a seventh embodiment of the present invention.
Figure 15B:
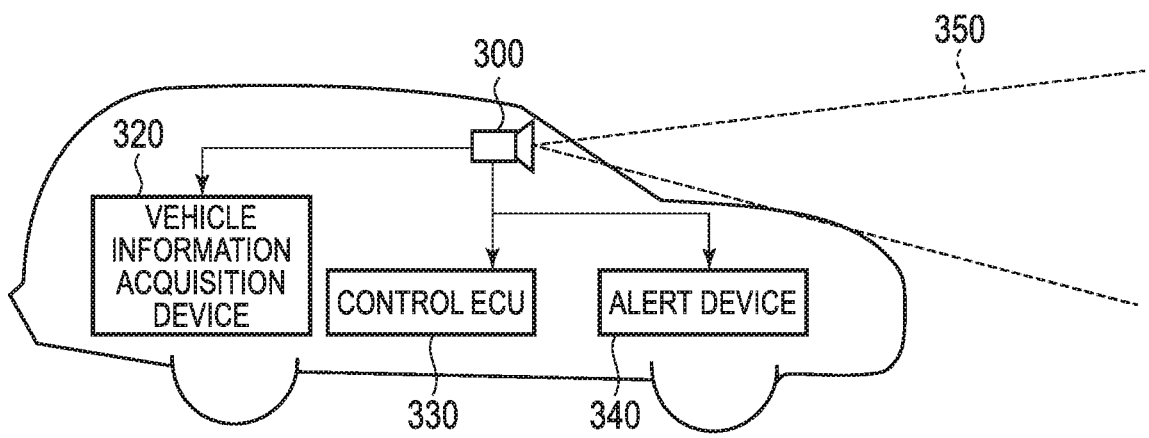
FIG. 15B is a diagram illustrating a configuration example of a movable object according to the seventh embodiment of the present invention.

An imaging system and a movable object according to a seventh embodiment of the present invention will be described by using FIG. 15A and FIG. 15B. FIG. 15A is a diagram illustrating the configuration of the imaging system according to the present embodiment. FIG. 15B is a diagram illustrating the configuration of the movable object according to the present embodiment.

FIG. 15A illustrates one example of an imaging system related to an on-vehicle camera. An imaging system 300 includes an imaging device 310. The imaging device 310 is any of the photoelectric conversion devices 100 described in any of the above first to fifth embodiments. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to an object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to an object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like or may be implemented by a combination thereof.

The imaging system 300 is connected to a vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 15B illustrates the imaging system in a case of capturing a front area of a vehicle (a capturing region 350). The vehicle information acquisition device 320 transmits instructions to the imaging system 300 or imaging device 310. Such a configuration can further improve the ranging accuracy.

Although an example of control for avoiding a collision to another vehicle has been described in the description above, it is also applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiment

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, in the photoelectric conversion device 100 of the first to fifth embodiments, a pixel circuit forming the unit pixel P is not limited to that illustrated. For example, the counter circuit forming the signal processing circuit is not limited to the configuration corresponding to the illustrated number of counter bits.

Further, while an operational circuit that replaces a count value of the counter circuit with a predetermined substitute value when the count value exceeds a predetermined threshold value has been illustrated as an example in the fourth and fifth embodiments, the threshold value or the substitute value of the counter circuit or the circuit configuration of the operational circuit is not limited to that in the embodiment described above and can be changed as appropriate.

Further, the imaging systems illustrated in the sixth and seventh embodiments described above are examples of an imaging system to which the photoelectric conversion device of the present invention may be applied, the imaging system to which the photoelectric conversion device of the present invention can be applied is not limited to the configuration illustrated in FIG. 14 and FIG. 15A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-050662, filed Mar. 19, 2018, which is hereby incorporated by reference herein in its entirety.

REFERENCE SIGNS LIST

P . . . unit pixel
P1 . . . first pixel
P2 . . . second pixel

T-FFa0 to T-FFa3, T-FFb0 to T-FFb3 . . . T-flip-flop circuit
20a, 20b . . . light receiving unit
30a, 30b, 30c, 30d, 30e, 30f . . . signal generation unit
32, 34, 36 . . . operational circuit

The invention claimed is:

1. A photoelectric conversion device comprising:
a plurality of pixels each including:
 a photoelectric conversion unit that outputs a pulse in response to incidence of a photon; and
 a signal generation unit that generates a signal in accordance with the number of pulses output from the photoelectric conversion unit,
wherein the plurality of pixels includes a first pixel in which an upper limit value of a signal generated by the signal generation unit is a first value and a second pixel in which an upper limit value of a signal generated by the signal generation unit is a second value that is smaller than the first value,
wherein the first pixel is arranged in a light receiving region, and
wherein the second pixel is arranged in an optical black region in which a light shielding member is provided.

2. The photoelectric conversion device according to claim 1,
wherein each of the signal generation unit of the first pixel and the signal generation unit of the second pixel includes a counter circuit that counts the number of pulses output from the corresponding photoelectric conversion unit, and
wherein the number of bits of the counter circuit of the second pixel is smaller than the number of bits of the counter circuit of the first pixel.

3. The photoelectric conversion device according to claim 2, wherein the signal generation unit of the second pixel further includes an operational circuit that compares an output value of the counter circuit with a predetermined threshold value.

4. The photoelectric conversion device according to claim 3, wherein when the output value exceeds the threshold value, the operational circuit replaces the output value with a predetermined value that is less than or equal to the threshold value.

5. The photoelectric conversion device according to claim 3, wherein when the output value exceeds the threshold value, the operational circuit resets a count value of the counter circuit.

6. The photoelectric conversion device according to claim 3, wherein the threshold value is set based on a determination criterion for a defective pixel.

7. The photoelectric conversion device according to claim 1 further comprising:
a first substrate in which the photoelectric conversion unit of each of the plurality of pixels is provided; and
a second substrate in which the signal generation unit of each of the plurality of pixels is provided.

8. An imaging system comprising:
the photoelectric conversion device according to claim 1; and
a signal processing unit that processes a signal output from the photoelectric conversion device.

9. A movable object comprising:
the photoelectric conversion device according to claim 1;
a distance information acquisition unit that acquires distance information on a distance to an object, from a parallax image based on signals from the photoelectric conversion device; and
a control unit that controls the movable object based on the distance information.

10. A photoelectric conversion device comprising:
a plurality of pixels each including:
 a photoelectric conversion unit that outputs a pulse in response to incidence of a photon; and
 a signal generation unit that generates a signal in accordance with the number of pulses output from the photoelectric conversion unit,
wherein the plurality of pixels includes a first pixel in which an upper limit value of a signal generated by the signal generation unit is a first value and a second pixel in which an upper limit value of a signal generated by the signal generation unit is a second value that is smaller than the first value, and
wherein a light receiving sensitivity of the second pixel is lower than a light receiving sensitivity of the first pixel.

11. The photoelectric conversion device according to claim 10,
wherein each of the signal generation unit of the first pixel and the signal generation unit of the second pixel includes a counter circuit that counts the number of pulses output from the corresponding receiving unit, and
wherein the number of bits of the counter circuit of the second pixel is smaller than the number of bits of the counter circuit of the first pixel.

12. The photoelectric conversion device according to claim 10, wherein the signal generation unit of the second pixel further includes an operational circuit that compares an output value of the counter circuit with a predetermined threshold value.

13. The photoelectric conversion device according to claim 12, wherein when the output value exceeds the threshold value, the operational circuit replaces the output value with a predetermined value that is less than or equal to the threshold value.

14. The photoelectric conversion device according to claim 12, wherein when the output value exceeds the threshold value, the operational circuit resets a count value of the counter circuit.

15. The photoelectric conversion device according to claim 12, wherein the threshold value is set based on a determination criterion for a defective pixel.

16. The photoelectric conversion device according to claim 10, wherein the second pixel includes the photoelectric conversion unit whose area is smaller than the photoelectric conversion unit of the first pixel in a plan view.

17. The photoelectric conversion device according to claim 16, wherein the signal generation unit of one of a pair of two second pixels further includes an operational circuit that outputs a differential value between an output value of the counter circuit of the one of the second pixels and an output value of the counter circuit of the other of the second pixels.

18. The photoelectric conversion device according to claim 10 further comprising:
a first substrate in which the photoelectric conversion unit of each of the plurality of pixels is provided; and
a second substrate in which the signal processing unit of each of the plurality of pixels is provided.

19. An imaging system comprising:
the photoelectric conversion device according to claim 10; and
a signal processing unit that processes a signal output from the photoelectric conversion device.

20. A movable object comprising:
the photoelectric conversion device according to claim 10;
a distance information acquisition unit that acquires distance information on a distance to an object, from a parallax image based on signals from the photoelectric conversion device; and
a control unit that controls the movable object based on the distance information.

* * * * *